US012672498B2

(12) United States Patent
Chen et al.

(10) Patent No.:  US 12,672,498 B2
(45) Date of Patent:       Jun. 30, 2026

(54) METHOD OF MANUFACTURING SEMICONDUCTOR STRUCTURE

(71) Applicant: Advanced Semiconductor Engineering, Inc., Kaohsiung (TW)

(72) Inventors: Bo Hua Chen, Kaohsiung (TW); Yan Ting Shen, Kaohsiung (TW); Tsung Chi Wu, Kaohsiung (TW); Tai-Hung Kuo, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 855 days.

(21) Appl. No.: 17/390,694

(22) Filed: Jul. 30, 2021

(65) Prior Publication Data

US 2023/0037117 A1      Feb. 2, 2023

(51) Int. Cl.
| | |
|---|---|
| *H01L 21/78* | (2006.01) |
| *H01L 21/268* | (2006.01) |
| *H10P 34/42* | (2026.01) |
| *H10P 54/00* | (2026.01) |

(52) U.S. Cl.
CPC .............. H10P 54/00 (2026.01); H10P 34/42 (2026.01)

(58) Field of Classification Search
CPC ........... H01L 21/78–786; H01L 21/268; B81C 1/00904; H10P 54/00; H10P 34/42
See application file for complete search history.

(56) References Cited

U.S. PATENT DOCUMENTS

2018/0286735 A1*  10/2018  Mackh ................ H01L 21/6835
2020/0051860 A1*   2/2020  Wyant ............... H01L 21/67092

* cited by examiner

*Primary Examiner* — Leonard Chang
*Assistant Examiner* — Stanetta D Isaac
(74) *Attorney, Agent, or Firm* — Foley and Lardner LLP

(57)            ABSTRACT

A method of manufacturing a semiconductor structure is provided. The method includes the following operations: providing a semiconductor substrate; performing a first cutting operation along a first set of cutting lines of the semiconductor substrate; and performing a second cutting operation along a second set of cutting lines of the semiconductor substrate later than performing the first cutting operation, wherein the second set of cutting lines are arranged interlacedly with the first set of cutting lines along a first direction.

6 Claims, 10 Drawing Sheets

METHOD OF MANUFACTURING SEMICONDUCTOR STRUCTURE

BACKGROUND

1. Technical Field

The present disclosure relates generally to a method of manufacturing a semiconductor structure.

2. Description of the Related Art

Semiconductor devices are usually manufactured by forming components and/or functional structures on a semiconductor wafer followed by singulation to form individual semiconductor devices. Singulation may be performed by various techniques. While mechanical cutting technique may cause wafer chipping, laser cutting technique can raise different issues.

SUMMARY

In one or more embodiments, a method of manufacturing a semiconductor structure includes the following operations: providing a semiconductor substrate; performing a first cutting operation along a first set of cutting lines of the semiconductor substrate; and performing a second cutting operation along a second set of cutting lines of the semiconductor substrate later than performing the first cutting operation, wherein the second set of cutting lines are arranged interlacedly with the first set of cutting lines along a first direction.

In one or more embodiments, a method of manufacturing a semiconductor structure includes the following operations: providing a semiconductor substrate; applying a first set of condensed energy to a plurality of first positions in an interior region of the semiconductor substrate; and applying a second set of condensed energy to a plurality of second positions in the interior region of the semiconductor substrate after applying the first set of condensed energy to the first positions, wherein the second positions are arranged interlacedly with the first positions along a first direction.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

FIG. 1, FIG. 1A, FIG. 2A, FIG. 2B, FIG. 3A, FIG. 3B, FIG. 4A, FIG. 4B, FIG. 5A, FIG. 5B, FIG. 6, and FIG. 7 illustrate various operations in a method of manufacturing a semiconductor structure in accordance with some embodiments of the present disclosure.

Figure 1:
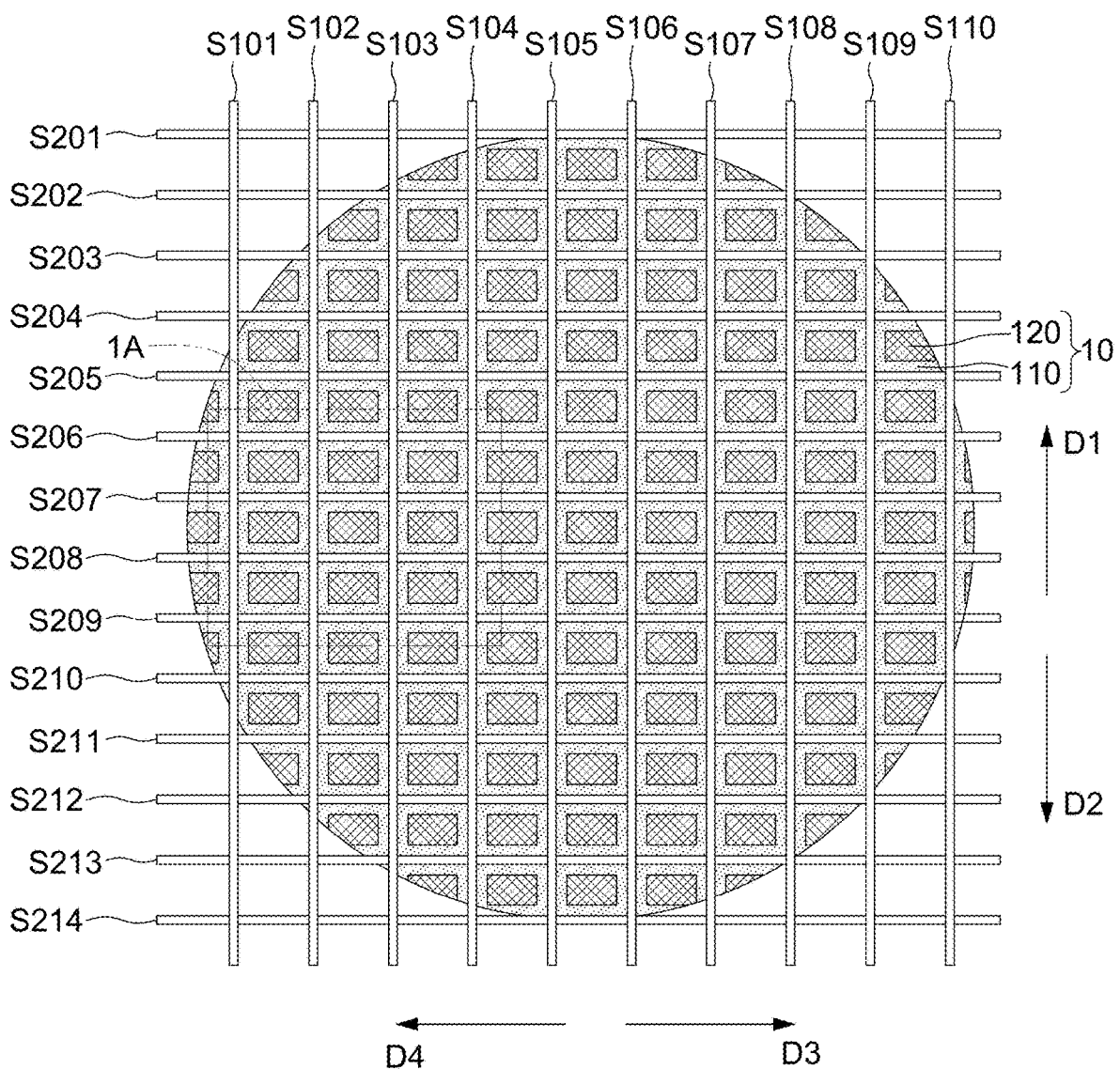
FIG. 1, FIG. 1A, FIG. 2A, FIG. 2B, FIG. 3A, FIG. 3B, FIG. 4A, FIG. 4B, FIG. 5A, FIG. 5B, FIG. 6, and FIG. 7 illustrate various operations in a method of manufacturing a semiconductor structure in accordance with some embodiments of the present disclosure.

Referring to FIG. 1, a semiconductor substrate 10 may be provided. In some embodiments, the semiconductor substrate 10 includes a microelectromechanical system (MEMS) wafer. In some embodiments, the semiconductor substrate 10 includes one or more thin film devices. In some embodiments, the semiconductor substrate 10 includes one or more MEMS devices.

In some embodiments, two or more cutting operations may be performed on the semiconductor substrate 10. In some embodiments, the two or more cutting operations may be performed from an active surface of the semiconductor substrate 10. In some embodiments, the semiconductor substrate 10 may have a plurality of cutting lines (e.g., cutting lines S101 to S110 and S201 to S214, but the numbers and arrangements of the cutting lines are not limited thereto), and the two or more cutting operations may be performed on the semiconductor substrate 10 along the cutting lines. In some embodiments, a pitch of the cutting lines of the semiconductor substrate 10 is less than about 3 millimeters (mm). In some embodiments, the cutting lines may be grouped into a plurality of sets of cutting lines, and the details will be discussed hereinafter. It should be noted that the number of sets of the cutting lines of the semiconductor substrate 10, the number of cutting lines in each set of the plurality sets of the cutting lines of the semiconductor substrate 10, and the arrangements of the sets of the cutting lines of the semiconductor substrate 10 described hereinafter are for exemplary purposes only, rather than a limitation of the present disclosure. The number of sets of the cutting lines, the number of cutting lines in each set of the plurality sets of the cutting lines, and the arrangements of the sets of the cutting lines of the semiconductor substrate 10 may vary according to actual applications without departing from the spirit and scope of the present disclosure.

In some embodiments, two cutting operations may be performed on the semiconductor substrate 10, for example, along a same direction, and the cutting lines may include two sets of cutting lines that are arranged interlacedly or alternatively and corresponding to the two cutting operations respectively. In some embodiments, the plurality of cutting lines include a first set of cutting lines (e.g., the cutting lines S101, S103, S105, S107, and S109) and a second set of cutting lines (e.g., the cutting lines S102, S104, S106, S108, and S110) arranged interlacedly with the first set of cutting lines (e.g., the cutting lines S101, S103, S105, S107, and S109) along a direction (e.g., a direction D3). In some embodiments, the first set of cutting lines S101, S103, S105, S107, and S109 and the second set of cutting lines S102, S104, S106, S108, and S110 are arranged alternatively.

Referring to FIG. 1, a first cutting operation may be performed along the first set of cutting lines S101, S103, S105, S107, and S109 of the semiconductor substrate 10, and a second cutting operation may be performed along the second set of cutting lines S102, S104, S106, S108, and S110 of the semiconductor substrate 10 later than performing the first cutting operation. In some embodiments, the second cutting operation is performed after the first cutting operation is completed.

In some other embodiments, three cutting operations may be performed on the semiconductor substrate 10, for example, along a same direction, and the cutting lines may include three sets of cutting lines corresponding to the three cutting operations respectively. In some embodiments, the plurality of cutting lines include a first set of cutting lines (e.g., the cutting lines S101, S104, S107, and S110), a second set of cutting lines (e.g., the cutting lines S102, S105, and S108) arranged interlacedly with the first set of cutting lines (e.g., the cutting lines S101, S104, S107) along a direction (e.g., a direction D3), and an additional set of cutting lines (e.g., the cutting lines S103, S106, and S109) arranged interlacedly with the second set of cutting lines (e.g., the cutting lines S102, S105, and S108) along a direction (e.g., a direction D3). In some embodiments, the first set of cutting lines S101, S104, S107, and S110 and the second set of cutting lines S102, S105, and S108 are arranged alternatively, and the second set of cutting lines S102, S105, and S108 and the additional set of cutting lines S103, S106, and S109 are arranged alternatively.

In some embodiments, two further cutting operations may be performed on the semiconductor substrate 10, for example, along a same direction that is different from the direction along which the first two cutting operations are performed. In some embodiments, the plurality of cutting lines of the semiconductor substrate 10 may further include a third set of cutting lines (e.g., the cutting lines S201, S203, S205, S207, S209, S211, and S213) and a fourth set of cutting lines (e.g., the cutting lines S202, S204, S206, S208, S210, S212, and S214) arranged interlacedly with the third set of cutting lines (e.g., the cutting lines S201, S203, S205, S207, S209, S211, and S213) along a direction (e.g., a direction D2). In some embodiments, the direction D2 is substantially perpendicular to the direction D3. In some embodiments, the third set of cutting lines S201, S203, S205, S207, S209, S211, and S213 and the fourth set of cutting lines S202, S204, S206, S208, S210, S212, and S214 are arranged alternatively. In some embodiments, the third set of cutting lines (e.g., the cutting lines S201, S203, S205, S207, S209, S211, and S213) are substantially perpendicular to the first set of cutting lines (e.g., the cutting lines S101, S103, S105, S107, and S109). In some embodiments, the fourth set of cutting lines (e.g., the cutting lines S202, S204, S206, S208, S210, S212, and S214) are substantially perpendicular to the second set of cutting lines (e.g., the cutting lines S102, S104, S106, S108, and S110).

Referring to FIG. 1, a third cutting operation may be performed along the third set of cutting lines S201, S203, S205, S207, S209, S211, and S213 of the semiconductor substrate 10, and a fourth cutting operation may be performed along the fourth set of cutting lines S202, S204, S206, S208, S210, S212, and S214 of the semiconductor substrate 10 later than performing the third cutting operation. In some embodiments, the fourth cutting operation is performed after the third cutting operation is completed. In some embodiments, the third cutting operation and the fourth cutting operation are performed after the first cutting operation and the second cutting operation are completed.

In some other embodiments, three further cutting operations may be performed on the semiconductor substrate 10, for example, along a same direction that is different from the direction along which the first two cutting operations are performed. In some embodiments, the plurality of cutting lines of the semiconductor substrate 10 may further include a third set of cutting lines (e.g., the cutting lines S201, S204, S207, S210, and S213), a fourth set of cutting lines (e.g., the cutting lines S202, S205, S208, S211, and S214) arranged interlacedly with the third set of cutting lines (e.g., the cutting lines S201, S203, S205, S207, S209, S211, and S213) along a direction (e.g., a direction D2), and an additional set of cutting lines (e.g., the cutting lines S203, S206, S209, and S212) arranged interlacedly with the fourth set of cutting lines (e.g., the cutting lines S202, S205, S208, S211, and S214). In some embodiments, the direction D2 is substantially perpendicular to the direction D3. In some embodiments, the third set of cutting lines S201, S204, S207, S210, and S213 and the fourth set of cutting lines S202, S205, S208, S211, and S214 are arranged alternatively. In some embodiments, the fourth set of cutting lines S202, S205, S208, S211, and S214 and the additional set of cutting lines S203, S206, S209, and S212 are arranged alternatively.

Figure 1A:
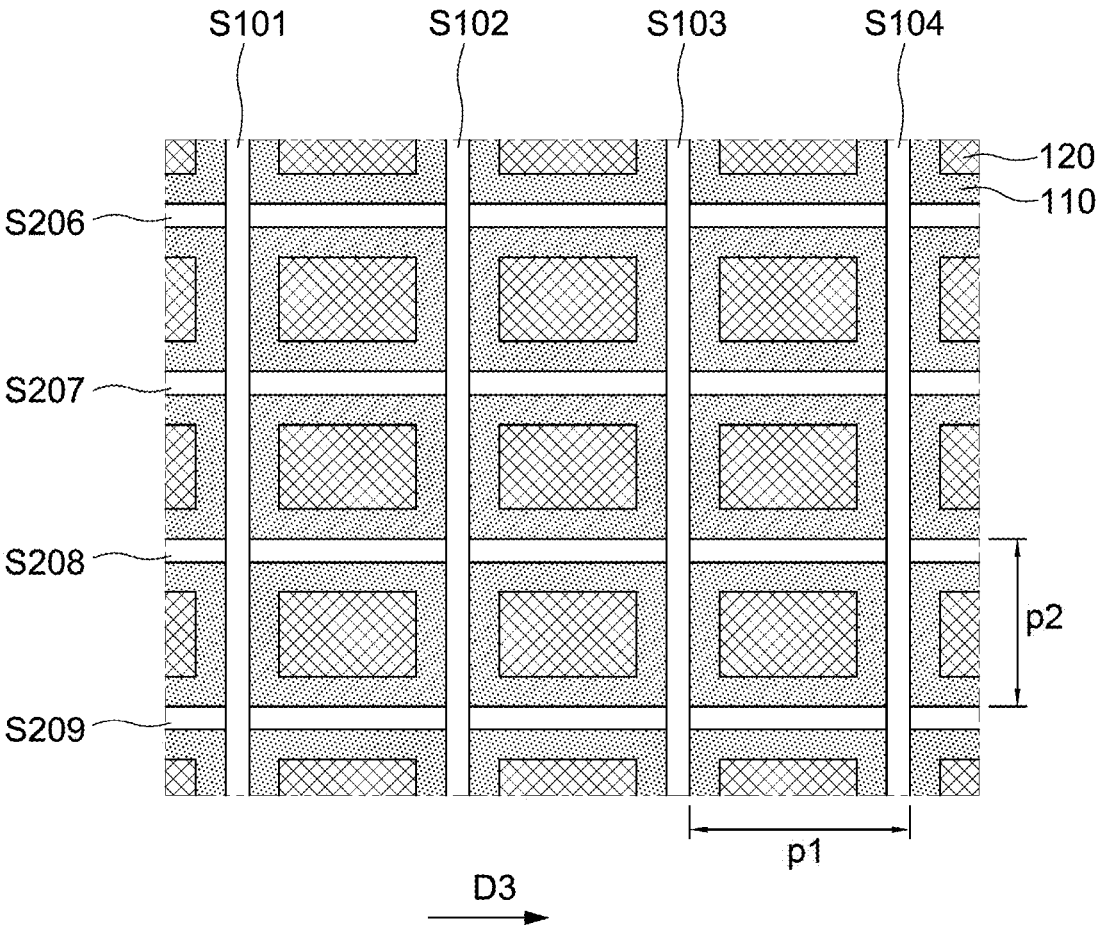

Referring to FIG. 1A, which illustrates a top view of a portion of the semiconductor substrate 10. In some embodiments, FIG. 1A illustrates a top view of a portion 1A of the semiconductor substrate 10 as shown in FIG. 1. In some embodiments, the semiconductor substrate 10 includes a plurality of device regions 120 separated from each other by the plurality of cutting lines. In some embodiments, a size of each of the device regions 120 is less than about 3 mm×3 mm. In some embodiments, a size of each of the device regions 120 is less than about 2 mm×2 mm. In some embodiments, a size of each of the device regions 120 is less than about 1 mm×1 mm. In some embodiments, the semiconductor substrate 10 includes a silicon substrate 110. In some embodiments, the device regions 120 include at least a circuit layer or element. In some embodiments, the device regions 120 include at least a thin film device. In some embodiments, each of the device regions 120 includes at least a thin film device, e.g., a MEMS device.

In some embodiments, a pitch p1 of the cutting lines (e.g., the cutting lines S101 to S110) of the semiconductor substrate 10 along the direction D3 is less than about 3 mm. In some embodiments, a pitch p1 of the cutting lines (e.g., the cutting lines S101 to S110) of the semiconductor substrate 10 along the direction D3 is less than about 2 mm. In some embodiments, a pitch p1 of the cutting lines (e.g., the cutting lines S101 to S110) of the semiconductor substrate 10 along the direction D3 is less than about 1 mm. In some embodiments, a pitch p2 of the cutting lines (e.g., the cutting lines S201 to S214) of the semiconductor substrate 10 along the direction D1 is less than about 3 mm. In some embodiments, a pitch p2 of the cutting lines (e.g., the cutting lines S201 to S214) of the semiconductor substrate 10 along the direction D1 is less than about 2 mm. In some embodiments, a pitch p2 of the cutting lines (e.g., the cutting lines S201 to S214) of the semiconductor substrate 10 along the direction D1 is less than about 1 mm.

Figure 2A:
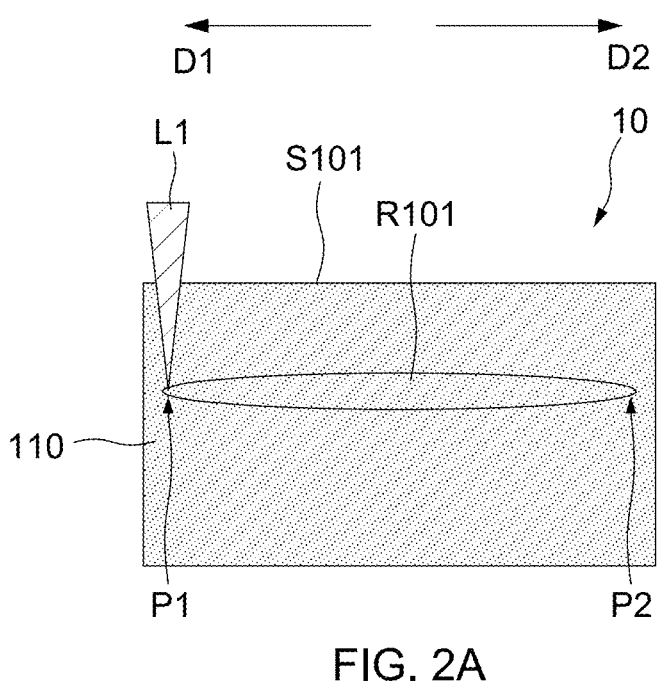
Figure 2B:
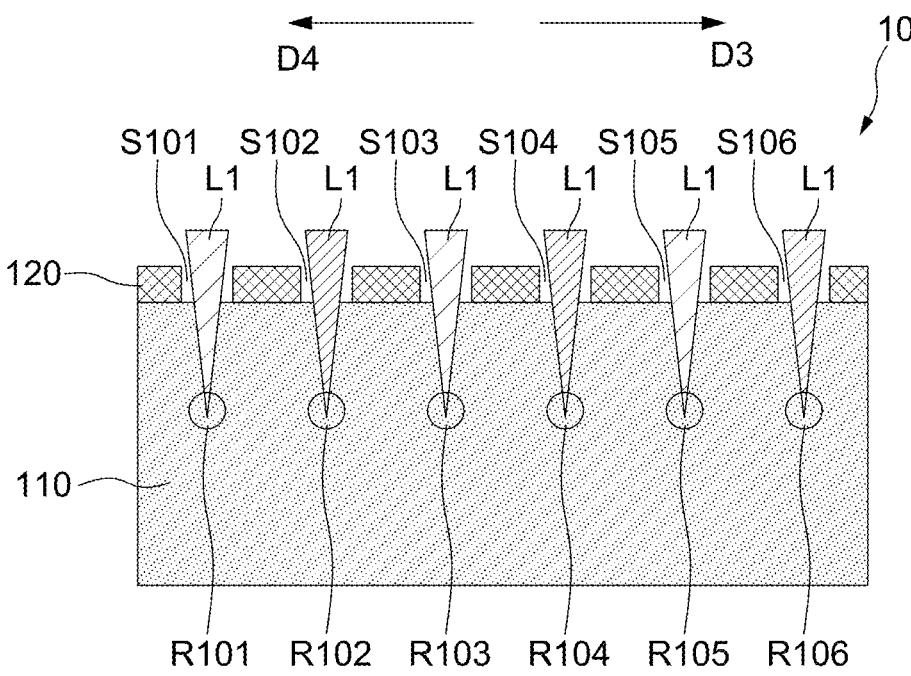

FIG. 2A illustrates a cross-sectional view of a portion of the semiconductor substrate 10 crossing the cutting line S101 along the direction D2, and FIG. 2B illustrates a cross-sectional view of a portion of the semiconductor substrate 10 along the direction D3. In some embodiments, the device regions 120 may be disposed on, in proximity to, adjacent to, or embedded in and exposed at an upper surface of the silicon substrate 110. In some embodiment, the device regions 120 may be disposed on, in proximity to, adjacent to, or embedded in and exposed at an active surface of the semiconductor substrate 10.

Referring to FIGS. 1, 2A, and 2B, in some embodiments, performing the first cutting operation includes cutting along the first set of cutting lines S101, S103, S105, S107, and S109 of the semiconductor substrate 10, and performing the second cutting operation includes cutting along the second set of cutting lines S102, S104, S106, S108, and S110 of the semiconductor substrate 10. In some embodiments, performing the first cutting operation includes cutting along a first cutting line (e.g., the cutting line S101) to a last cutting line (e.g., the cutting line S109) of the first set of cutting lines sequentially along the direction D3. In some embodiments, every two adjacent cutting lines of the first set of cutting lines S101, S103, S105, S107, and S109 are cut along opposite directions. For example, the cutting lines S101, S105, and S109 are cut along the direction D2, and the cutting lines S103 and S107 are cut along the direction D1. In some embodiments, referring to FIG. 1, the first cutting operation may be performed by cutting along the cutting line S101 along the direction D2, cutting along the cutting S103 along the direction D1, cutting along the cutting line S105 along the direction D2, cutting along the cutting S107 along the direction D1, and cutting along the cutting line S109 along the direction D2, and the cutting lines S101 to S109 are cut sequentially along the direction D3. In some embodiments, performing the second cutting operation includes cutting along a first cutting line (e.g., the cutting line S110) to a last cutting line (e.g., the cutting line S102) of the second set of cutting lines sequentially along the direction D4 opposite to the direction D3. In some embodiments, every two adjacent cutting lines of the second set of cutting lines S102, S104, S106, S108, and S110 are cut along opposite directions. For example, the cutting lines S110, S106, and S102 are cut along the direction D1, and the cutting lines S108 and S104 are cut along the direction D2. In some embodiments, referring to FIG. 1, the second cutting operation may be performed by, later than cutting along the cutting line S109 along the direction D2, cutting along the cutting line S110 along the direction D1, cutting along the cutting S108 along the direction D2, cutting along the cutting line S106 along the direction D1, cutting along the cutting S104 along the direction D2, and cutting along the cutting line S102 along the direction D1, and the cutting lines S110 to S102 are cut sequentially along the direction D4.

In some embodiments, cutting the semiconductor substrate 10 along the cutting lines may be performed by scanning along the cutting lines of the semiconductor substrate 10 by a laser beam. Referring to FIGS. 1, 2A, and 2B, in some embodiments, performing the first cutting operation includes scanning a laser beam L1 along the first set of cutting lines S101, S103, S105, S107, and S109 with the laser beam L1 focused at an interior region of the semiconductor substrate 10, and performing the second cutting operation includes scanning a laser beam L1 along the second set of cutting lines S102, S104, S106, S108, and S110 with the laser beam L1 focused at an interior region of the semiconductor substrate 10. For example, as shown in FIG. 2A, a portion R101 in an interior region of the semiconductor substrate 10 is available to be scanned by the laser beam L1 along the cutting line S101. The laser beam L1 may focus at the focusing point P1 of the portion R101 as a starting point before start scanning, and the focusing point P2 of the portion R101 may serve as an end point for the laser scanning operation. In some embodiments, every two adjacent cutting lines of the first set of cutting lines S101, S103, S105, S107, and S109 are scanned by the laser beam L1 along opposite directions. For example, the cutting lines S101, S105, and S109 are scanned along the direction D2, and the cutting lines S103 and S107 are scanned along the direction D1.

In some embodiments, cutting the semiconductor substrate 10 along the cutting lines may be performed by applying a set of condensed energy to a plurality of positions in an interior region of the semiconductor substrate 10. Referring to FIGS. 1, 2A, and 2B, in some embodiments, a first set of condensed energy may be applied to a plurality of first positions (e.g., positions corresponding to portions R101, R103, and R105, for example, positions which the portions R101, R103, and R105 are around or positions inside the portions R101, R103, and R105) in an interior region of the semiconductor substrate 10, and a second set of condensed energy may be applied to a plurality of second positions (e.g., positions corresponding to portions R102, R104, and R106, for example, positions which the portions R102, R104, and R106 are around or positions inside the portions R102, R104, and R106) in the interior region of the semiconductor substrate 10 after applying the first set of condensed energy to the first positions (e.g., positions corresponding to the portions R101, R103, and R105). In some embodiments, each of the second positions (e.g., positions corresponding to the portions R102, R104, and R106) is located between every two adjacent first positions (e.g., positions corresponding to the portions R101, R103, and R105). In some embodiments, the first positions are directly under the first set of cutting lines, and the second positions are directly under the second set of cutting lines.

In some embodiments, applying the first set of condensed energy includes applying a laser beam L1 to the first positions (e.g., positions corresponding to the portions R101, R103, and R105) sequentially along the direction D3, and applying the laser beam L1 to the plurality of second positions (e.g., positions corresponding to the portions R106, R104, and R102) sequentially along the direction D4 that is opposite to the direction D3. In some embodiments, the laser beam L1 is focused at the first positions and the second positions of the semiconductor substrate 10. In some embodiments, the laser beam L1 is focused inside the portions corresponding to the first positions and the second positions of the semiconductor substrate 10. In some embodiments, every two adjacent first positions are scanned by the laser beam L1 along opposite directions D1 and D2, respectively. In some embodiments, the directions D1 and D2 are perpendicular to the directions D3 and D4. In some embodiments, the first positions and the second positions are located in the silicon substrate 110. In some embodiments, the condensed energy may include condensed thermal energy generated by the laser beam L1. In some embodiments, the condensed energy (e.g., the condensed thermal energy) applied to the first positions and the second positions in the interior region of the semiconductor substrate 10 may be generated by the laser beam L1 focused at the first positions and the second positions in the interior region of the semiconductor substrate 10.

In some embodiments, the second set of condensed energy is applied to the second positions (e.g., corresponding to the portions R106, R104, and R102) of the semiconductor substrate 10 after the first positions (e.g., corresponding to the portions R101, R103, and R105) of the semiconductor substrate 10 are applied with the first set of condensed energy.

Figure 3A:
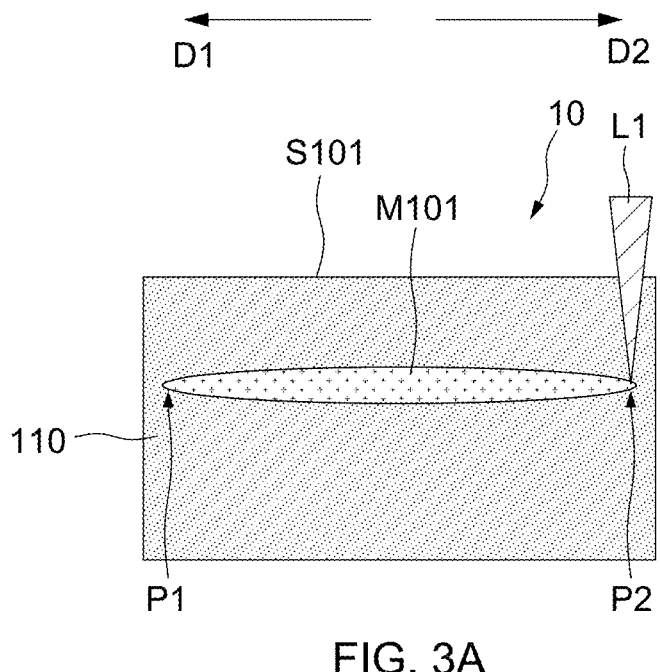
Figure 3B:
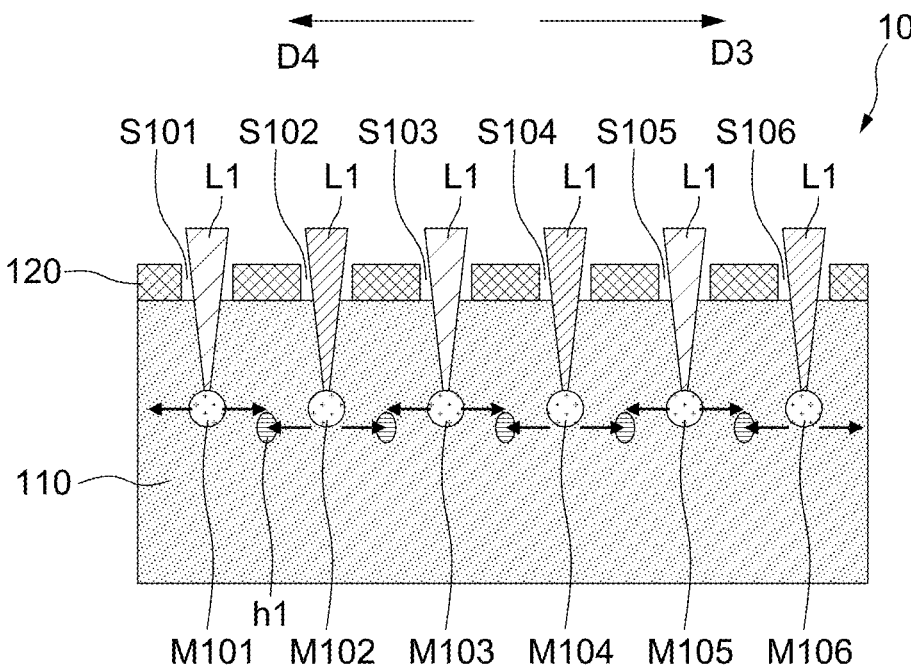

FIG. 3A illustrates a cross-sectional view of a portion of the semiconductor substrate 10 crossing the cutting line S101 along the direction D1, and FIG. 3B illustrates a cross-sectional view of a portion of the semiconductor substrate 10 along the direction D3. FIGS. 3A and 3B illustrate the semiconductor substrate 10 after performed with the first cutting operation and the second cutting operation in accordance with some embodiments of the present disclosure.

Referring to FIGS. 3A and 3B, after the first cutting operation and the second cutting operation are performed on the semiconductor substrate 10, a plurality of modification layers (also referred to as "cracks") are formed in an interior region of the semiconductor substrate 10. In some embodiments, the modification layers (or the cracks) may be formed by scanning a laser beam along the first set of cutting lines and the second set of cutting lines of the semiconductor substrate 10. For example, referring to FIG. 2A and FIG. 3A, a modification layer M101 may be formed in an interior region of the semiconductor substrate 10 after a laser scanning operation is performed by scanning the laser beam L1 along the cutting line S101 from the focusing point P1 (or the starting point) of the portion R101 to the focusing point P2 (or the end point) of the portion R101, so as to convert the portion R101 of the semiconductor substrate 10 into the modification layer M101.

In some embodiments, referring to FIGS. 2A-2B and FIGS. 3A-3B, portions around the first positions (e.g., the portions R101, R103, and R105) and portions around the second positions (e.g., the portions R102, R104, and R106) of the semiconductor substrate 10 are converted into a plurality of modification layers (e.g., modification layers M101 to M106) after respectively being applied with the first set of condensed energy and the second set of condensed energy. In some embodiments, the modification layers (e.g., the modification layers M101 to M106) have a reduced structural strength compared to that of the portions around the first positions (e.g., the portions R101, R103, and R105) and the portions around the second positions (e.g., the portions R102, R104, and R106) of the semiconductor substrate 10. In some embodiments, the second set of condensed energy is applied to the second positions (e.g., corresponding to the portions R102, R104, and R106) after the portions around the first positions (e.g., corresponding to the portions R101, R103, and R105) of the semiconductor substrate 10 are converted into the modification layers (e.g., the modification layers M101, M103, and M105). In some embodiments, a pitch of the modification layers M101 to M106 is less than about 3 mm. In some embodiments, a pitch of the modification layers M101 to M106 is less than about 2 mm. In some embodiments, a pitch of the modification layers M101 to M106 is less than about 1 mm.

According to some embodiments of the present disclosure, instead of applying condensed energy (e.g., condensed thermal energy) to adjacent positions or portions in an interior region of the semiconductor substrate 10 continuously in one operation, the positions or portions (e.g., the portions R101 to R106) in an interior region of the semiconductor substrate 10 are grouped into multiple sets of positions or portions, the positions or portions in the same set (e.g., the portions R101, R103, and R105) are not adjacent to each other, the positions or portions from different sets are arranged interlacedly or alternatively (e.g., the set of portions R101, R103, and R105 and the set of portions R102, R104, and R106), and condensed energy is applied to different sets of positions or portions in different operations. Therefore, condensed energy is applied to positions or portions that are relatively spaced apart from each other in one operation, thus heat accumulation can be reduced, a more uniform heat distribution can be achieved, fracture and/or chipping of the semiconductor substrate 10 caused by heat accumulation can be reduced or prevented, and yields can be increased.

In addition, according to some embodiments of the present disclosure, referring to FIG. 3B, when the first set of cutting lines (e.g., the cutting lines S101, S103, and S105) of the semiconductor substrate 10 are scanned by the laser beam L1 during the first cutting operation, other set(s) of cutting lines (e.g., the cutting lines S102, S104, and S106) that are arranged interlacedly with the first set of cutting lines (e.g., the cutting lines S101, S103, and S105) are not scanned by the laser beam L1. Therefore, heat caused by the laser beam L1 is only generated among the regions of the semiconductor substrate 10 corresponding to the first set of cutting lines (e.g., the cutting lines S101, S103, and S105) during the first cutting operation, and heat is not generated among the regions corresponding to the other set(s) of cutting lines (e.g., the cutting lines S102, S104, and S106), i.e., the spaces between the adjacent cutting lines of the first set of cutting lines, during the first cutting operation. When the other set(s) of cutting lines of the semiconductor substrate are scanned by the laser beam L1 in another cutting operation following the first cutting operation, the time delay between the first cutting operation and the following cutting operation allows the heat generated in the first cutting operation to at least partially dissipate from the semiconductor substrate 10. Thus, the accumulated heat h1 between adjacent cutting lines can be reduced. Therefore, undesired meandering, which may be generated and thereby observed on a surface (e.g., the active surface) of the semiconductor substrate 10, resulted from heat accumulation in the semiconductor substrate 10 can be reduced or prevented, and thus fracture and/or chipping of the semiconductor substrate 10 from the meandering can be prevented.

Figure 4A:
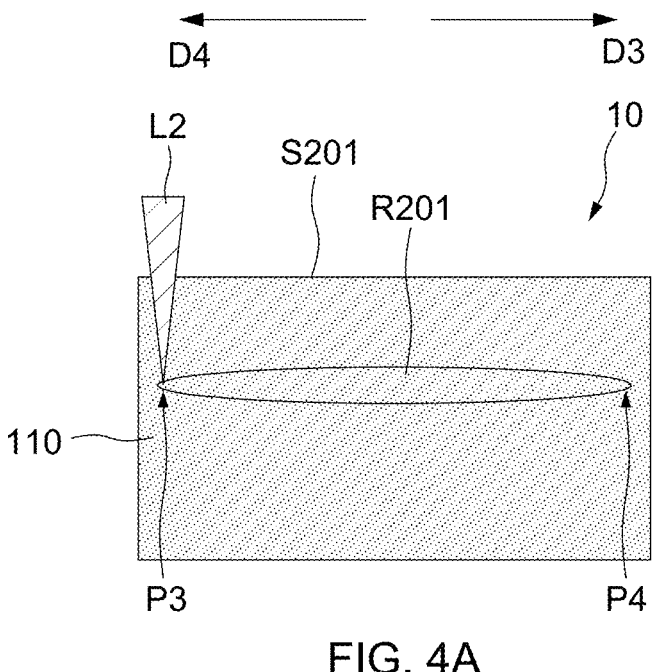
Figure 4B:
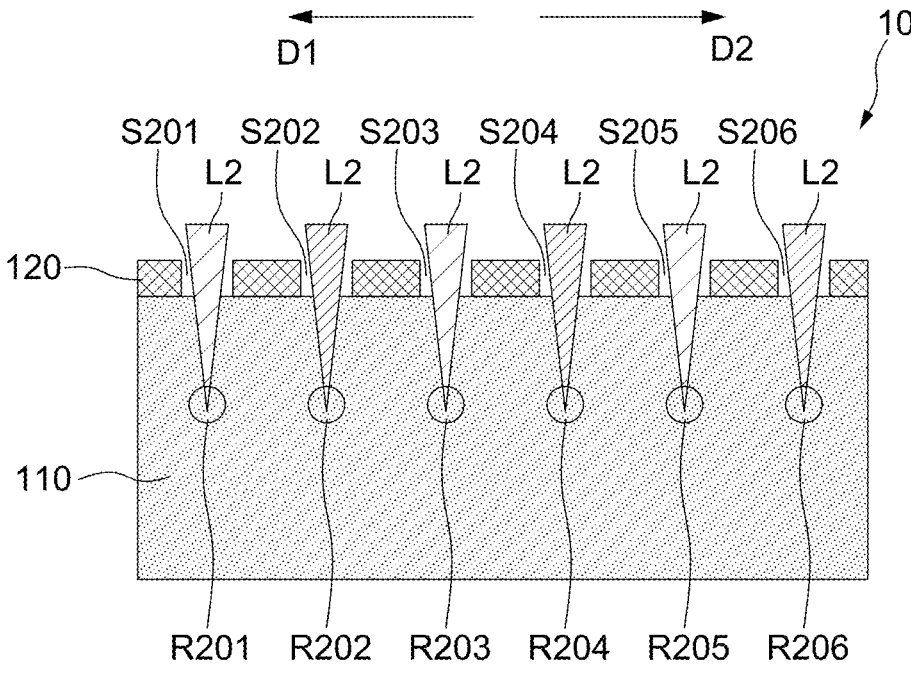

FIG. 4A illustrates a cross-sectional view of a portion of the semiconductor substrate 10 crossing the cutting line S201 along the direction D3, and FIG. 4B illustrates a cross-sectional view of a portion of the semiconductor substrate 10 along the direction D2.

Referring to FIGS. 1, 4A, and 4B, in some embodiments, performing the third cutting operation includes cutting along the third set of cutting lines S201, S203, S205, S207, S209, S211, and S213 of the semiconductor substrate 10, and performing the fourth cutting operation includes cutting along the fourth set of cutting lines S202, S204, S206, S208, S210, S212, and S214 of the semiconductor substrate 10. In some embodiments, performing the third cutting operation includes cutting along a first cutting line (e.g., the cutting line S201) to a last cutting line (e.g., the cutting line S213) of the third set of cutting lines sequentially along the direction D2. In some embodiments, every two adjacent cutting lines of the third set of cutting lines S201, S203, S205, S207, S209, S211, and S213 are cut along opposite directions. For example, the cutting lines S201, S205, S209, and S213 are cut along the direction D3, and the cutting lines S203, S207, and S211 are cut along the direction D4. In some embodiments, referring to FIG. 1, the third cutting operation may be performed by cutting along the cutting line S201 along the direction D3, cutting along the cutting S203 along the direction D4, cutting along the cutting line S205 along the direction D3, cutting along the cutting S207 along the direction D4, cutting along the cutting line S209 along the direction D3, cutting along the cutting S211 along the direction D3, and cutting along the cutting line S213 along the direction D3, and the cutting lines S201 to S213 are cut sequentially along the direction D2. In some embodiments, performing the fourth cutting operation includes cutting along a first cutting line (e.g., the cutting line S214) to a last cutting line (e.g., the cutting line S202) of the fourth set of cutting lines sequentially along the direction D1 opposite to the direction D2. In some embodiments, every two adjacent cutting lines of the fourth set of cutting lines S202, S204, S206, S208, S210, S212, and S214 are cut along opposite directions. For example, the cutting lines S202, S206, S210, and S214 are cut along the direction D4, and the cutting lines S204, S208, and S212 are cut along the direction D3. In some embodiments, referring to FIG. 1, the fourth cutting operation may be performed by, later than cutting along the cutting line S213 along the direction D3, cutting along the cutting line S214 along the direction D4, cutting along the cutting S212 along the direction D3, cutting along the cutting line S210 along the direction D4, cutting along the cutting S208 along the direction D3, cutting along the cutting line S206 along the direction D4, cutting along the cutting S204 along the direction D3, and cutting along the cutting line S202 along the direction D4, and the cutting lines S214 to S202 are cut sequentially along the direction D1.

In some embodiments, cutting the semiconductor substrate 10 along the cutting lines may be performed by scanning along the cutting lines of the semiconductor substrate 10 by a laser beam. Referring to FIGS. 1, 4A, and 4B, in some embodiments, performing the third cutting operation includes scanning a laser beam L2 along the third set of cutting lines S201, S203, S205, S207, S209, S211, and S213 with the laser beam L2 focused at an interior region of the semiconductor substrate 10, and performing the fourth cutting operation includes scanning a laser beam L2 along the fourth set of cutting lines S202, S204, S206, S208, S210, S212, and S214 with the laser beam L2 focused at an interior region of the semiconductor substrate 10. For example, as shown in FIG. 4A, a portion R201 in an interior region of the semiconductor substrate 10 is available to be scanned by the laser beam L2 along the cutting line S201. The laser beam L2 may focus at the focusing point P3 of the portion R201 as a starting point before start scanning, and the focusing point P4 of the portion R201 may serve as an end point for the laser scanning operation. In some embodiments, every two adjacent cutting lines of the third set of cutting lines S201, S203, S205, S207, S209, S211, and S213 are scanned by the laser beam L2 along opposite directions. For example, the cutting lines S201, S205, S209, and S213 are scanned along the direction D3, and the cutting lines S203, S207, and S211 are scanned along the direction D4.

In some embodiments, cutting the semiconductor substrate 10 along the cutting lines may be performed by applying a set of condensed energy to a plurality of positions in an interior region of the semiconductor substrate 10. Referring to FIGS. 1, 4A, and 4B, in some embodiments, a third set of condensed energy may be applied to a plurality of third positions (e.g., positions corresponding to portions R201, R203, and R205, for example, positions which the portions R201, R203, and R205 are around or positions inside the portions R201, R203, and R205) in an interior region of the semiconductor substrate 10, and a fourth set of condensed energy may be applied to a plurality of fourth positions (e.g., positions corresponding to portions R202, R204, and R206, for example, positions which the portions R202, R204, and R206 are around or positions inside the portions R202, R204, and R206) in the interior region of the semiconductor substrate 10 after applying the third set of condensed energy to the third positions (e.g., positions corresponding to the portions R201, R203, and R205). In some embodiments, each of the fourth positions (e.g., positions corresponding to the portions R202, R204, and R206) is located between every two adjacent third positions (e.g., positions corresponding to the portions R201, R203, and R205). In some embodiments, the third positions are directly under the third set of cutting lines, and the fourth positions are directly under the fourth set of cutting lines. In some embodiments, the third positions extend along a direction (e.g., the direction D3 or D4) substantially perpendicular to a direction (e.g., the direction D1 or D2) in which the first positions extend.

In some embodiments, applying the third set of condensed energy includes applying a laser beam L2 to the third positions (e.g., positions corresponding to the portions R201, R203, and R205) sequentially along the direction D2, and applying the laser beam L2 to the plurality of fourth positions (e.g., positions corresponding to the portions R206, R204, and R202) sequentially along the direction D1 that is opposite to the direction D2. In some embodiments, the laser beam L2 is focused at the third positions and the fourth positions of the semiconductor substrate 10. In some embodiments, the laser beam L2 is focused inside the portions corresponding to the third positions and the fourth positions of the semiconductor substrate 10. In some embodiments, every two adjacent third positions are scanned by the laser beam L2 along opposite directions D3 and D4, respectively. In some embodiments, the third positions and the fourth positions are located in the silicon substrate 110. In some embodiments, the condensed energy may include condensed thermal energy generated by the laser beam L2. In some embodiments, the condensed energy (e.g., the condensed thermal energy) applied to the third positions and the fourth positions in the interior region of the semiconductor substrate 10 may be generated by the laser beam L2 focused at the third positions and the fourth positions in the interior region of the semiconductor substrate 10.

In some embodiments, the fourth set of condensed energy is applied to the fourth positions (e.g., corresponding to the portions R206, R204, and R202) of the semiconductor substrate 10 after the third positions (e.g., corresponding to the portions R201, R203, and R205) of the semiconductor substrate 10 are applied with the third set of condensed energy. In some embodiments, the third positions and the fourth positions of the semiconductor substrate 10 are applied with condensed energy after the portions around the first positions and the second positions of the semiconductor substrate 10 are converted into the modification layers (e.g., the modification layers M101 to M106).

Figure 5A:
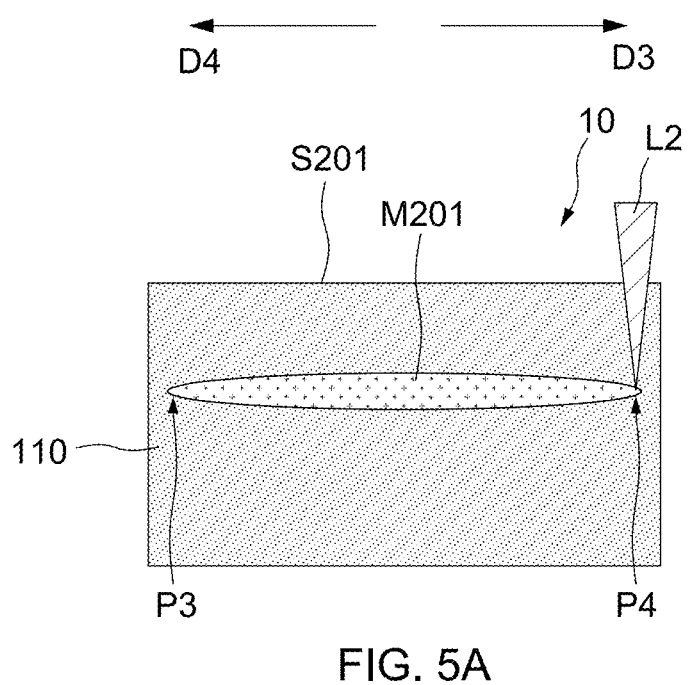
Figure 5B:
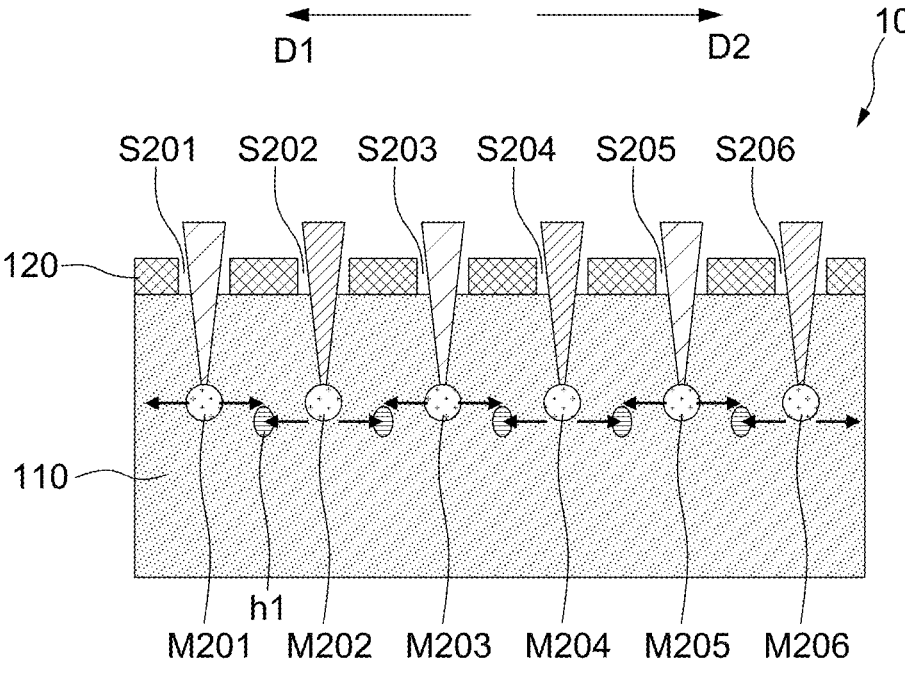

FIG. 5A illustrates a cross-sectional view of a portion of the semiconductor substrate 10 crossing the cutting line S201 along the direction D3, and FIG. 5B illustrates a cross-sectional view of a portion of the semiconductor substrate 10 along the direction D1. FIGS. 5A and 5B illustrate the semiconductor substrate 10 after performed with the third cutting operation and the fourth cutting operation in accordance with some embodiments of the present disclosure.

Referring to FIGS. 5A and 5B, after the third cutting operation and the fourth cutting operation are performed on the semiconductor substrate 10, a plurality of modification layers (also referred to as "cracks") are formed in an interior region of the semiconductor substrate 10. In some embodiments, the modification layers (or the cracks) may be formed by scanning a laser beam along the third set of cutting lines and the fourth set of cutting lines of the semiconductor substrate 10. For example, referring to FIG. 4A and FIG. 5A, a modification layer M201 may be formed in an interior region of the semiconductor substrate 10 after a laser scanning operation is performed by scanning the laser beam L2 along the cutting line S201 from the focusing point P3 (or the starting point) of the portion R201 to the focusing point P4 (or the end point) of the portion R201, so as to convert the portion R201 of the semiconductor substrate 10 into the modification layer M201.

In some embodiments, referring to FIGS. 4A-4B and FIGS. 5A-5B, portions around the third positions (e.g., the portions R201, R203, and R205) and the fourth positions (e.g., the portions R202, R204, and R206) of the semiconductor substrate 10 are converted into a plurality of modification layers (e.g., modification layers M201 to M206) after respectively being applied with the third set of condensed energy and the fourth set of condensed energy. In some embodiments, the modification layers (e.g., the modification layers M201 to M206) have a reduced structural strength compared to that of the portions around the third positions (e.g., the portions R201, R203, and R205) and the fourth positions (e.g., the portions R202, R204, and R206) of the semiconductor substrate 10. In some embodiments, the fourth set of condensed energy is applied to the fourth positions (e.g., corresponding to the portions R202, R204, and R206) after the portions around the third positions (e.g., corresponding to the portions R201, R203, and R205) of the semiconductor substrate 10 are converted into the modification layers (e.g., the modification layers M201, M203, and M205). In some embodiments, a pitch of the modification layers M201 to M206 is less than about 3 mm. In some embodiments, a pitch of the modification layers M201 to M206 is less than about 2 mm. In some embodiments, a pitch of the modification layers M201 to M206 is less than about 1 mm. In some embodiments, the modification layers M101 to M106 cross over the modification layers M201 to M206.

Figure 6:
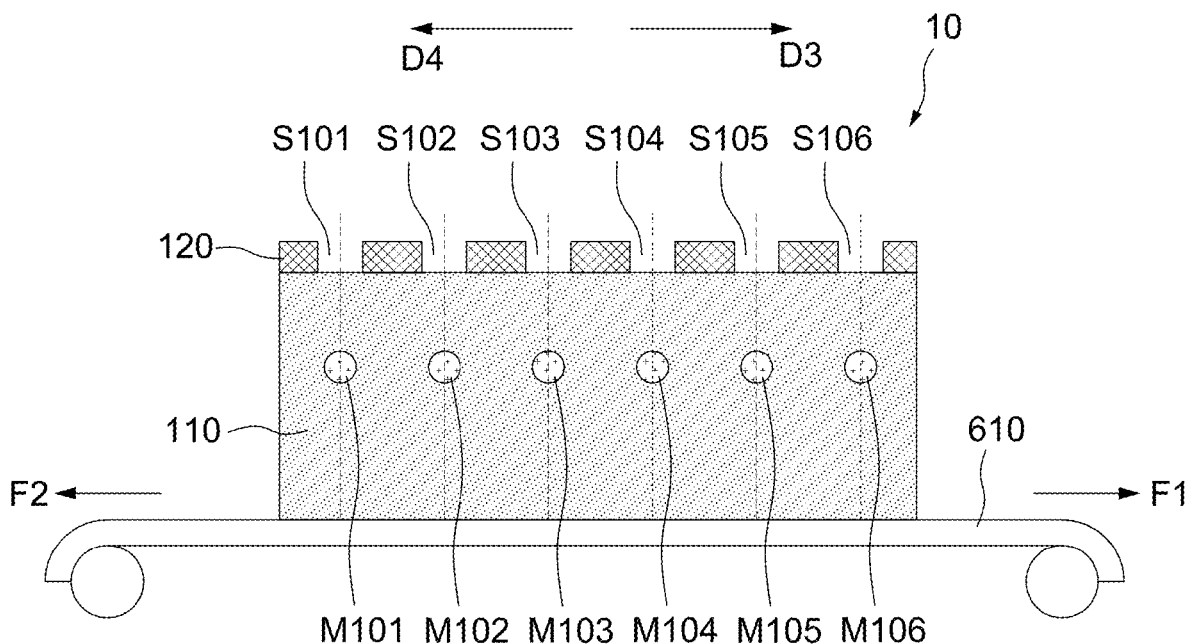
Figure 7:
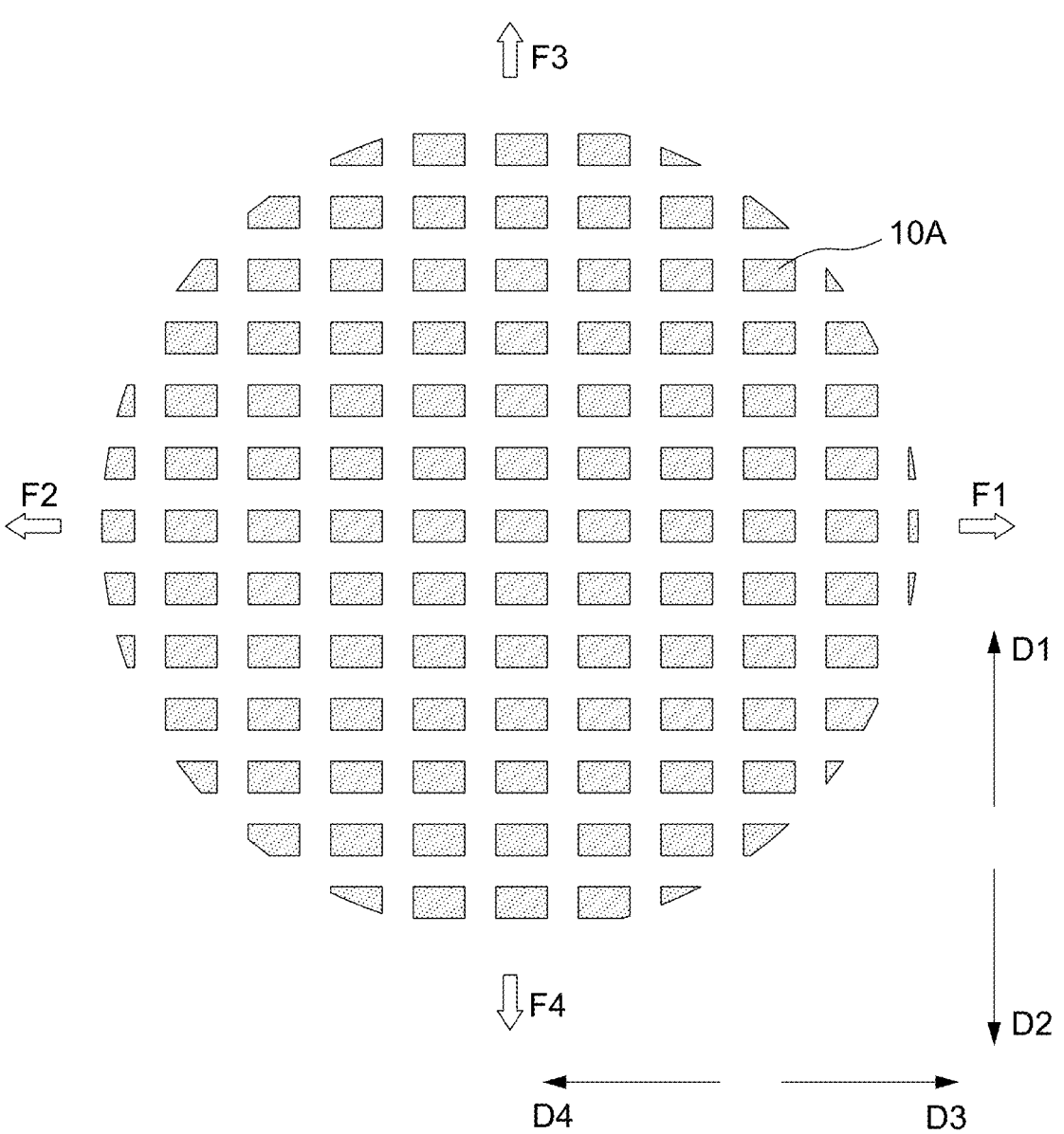

FIG. 6 illustrates a cross-sectional view of a portion of the semiconductor substrate 10 along the direction D3, and FIG. 7 illustrates a top view of the semiconductor substrate 10. Referring to FIGS. 6 and 7, a singulation operation may be performed on the semiconductor substrate 10 to form a plurality of singulated semiconductor structures 10A. In some embodiments, FIG. 6 illustrates a stage of the semiconductor substrate 10 prior to a singulation operation, and FIG. 7 illustrates a stage of the semiconductor substrate 10 after a singulation operation.

In some embodiments, the singulation operation includes separating the semiconductor substrate 10 into the plurality of singulated semiconductor structures 10A along the plurality of modification layers (or the cracks). In some embodiments, the semiconductor substrate 10 is separated into the singulated semiconductor structures 10A along the two sets of modification layers that are crossed over each other (e.g., the modifications layers M101 to M106 and M201 to M206). In some embodiments, referring to FIGS. 1 and 7, the semiconductor substrate 10 is expanded such that the semiconductor substrate 10 is separated into the singulated semiconductor structures 10A along the plurality of cutting lines.

In some embodiments, the semiconductor substrate 10 is expanded by pulling the semiconductor substrate 10 in directions away from a central region of the semiconductor substrate 10 with forces (e.g., forces F1, F2, F3, and F4), such that the semiconductor substrate 10 is pulled apart and separated into the singulated semiconductor structures 10A. In some embodiments, pulling the semiconductor substrate 10 includes adhering the semiconductor substrate 10 onto a tape 610, and stretching the tape 610. In some embodiments, a gap between adjacent device regions 120 is greater than about 10 µm after stretching the tape 610. In some embodiments, a gap between adjacent device regions 120 is from about 10 µm to about 20 µm after stretching the tape 610. In some embodiments, each of the singulated semiconductor structures 10A includes at least one device region 120. In some embodiments, the singulation operation of the semiconductor substrate 10 is referred to as a stealth dicing operation.

Figure 8A:
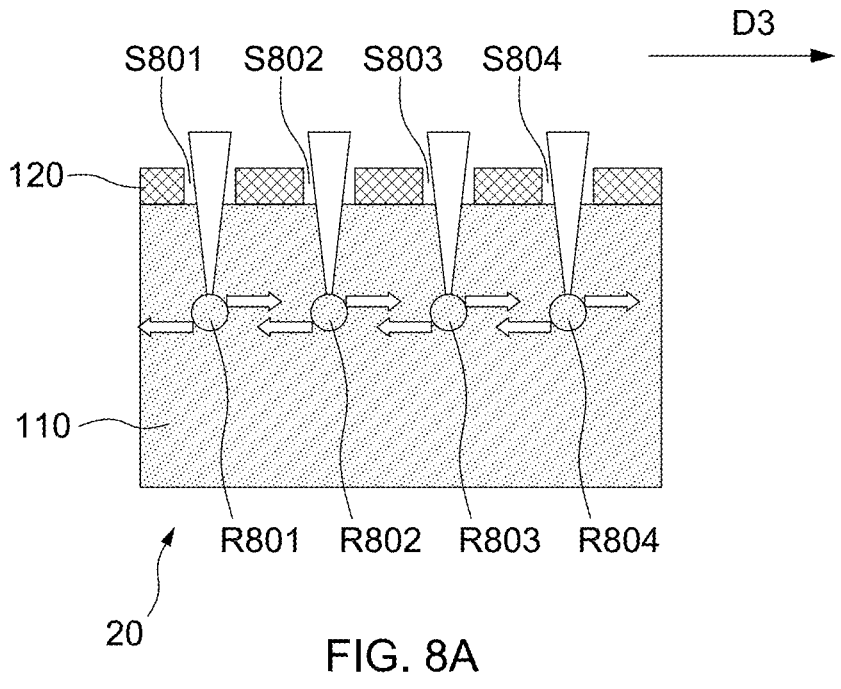
FIG. 8A and FIG. 8B illustrate various operations in a method of manufacturing a semiconductor structure in accordance with some comparative embodiments of the present disclosure.
Figure 8B:
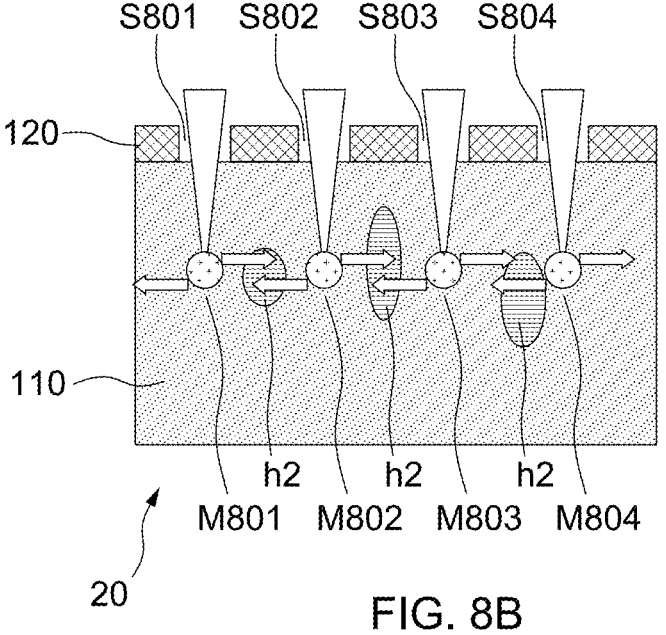

FIG. 8A and FIG. 8B illustrate various operations in a method of manufacturing a semiconductor structure in accordance with some comparative embodiments of the present disclosure. FIG. 8A illustrates a stage of the semiconductor substrate 20 prior to a cutting operation, and FIG. 8B illustrates a stage of the semiconductor substrate 20 after a cutting operation. In comparative embodiments, a cutting operation is performed on the semiconductor substrate 20 by scanning a laser beam along the cutting lines S801, S802, S803, and S804 sequentially along the direction D3 to apply condensed energy (e.g., condensed thermal energy) to the portions R801, R802, R803, and R804 continuously in one operation, so as to convert the portions R801, R802, R803, and R804 into modification layers M801, M802, M803, and M804. Such operation generates a large amount of accumulated heat h2 between adjacent portions.

Figure 9A:
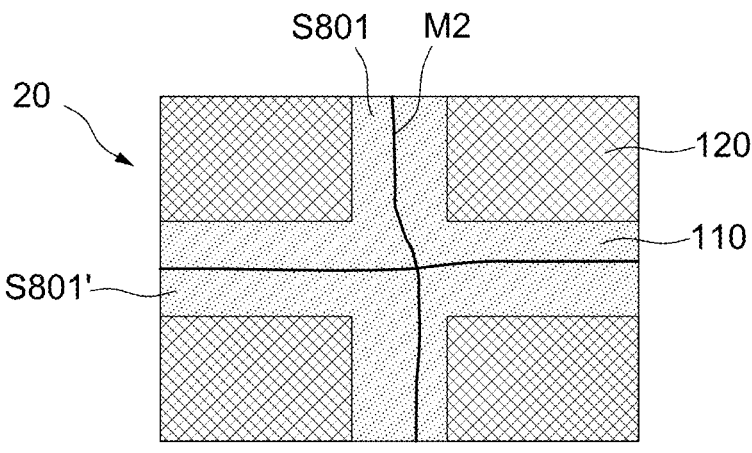
FIG. 9A illustrates a top view of a semiconductor structure in accordance with some comparative embodiments of the present disclosure.
Figure 9B:
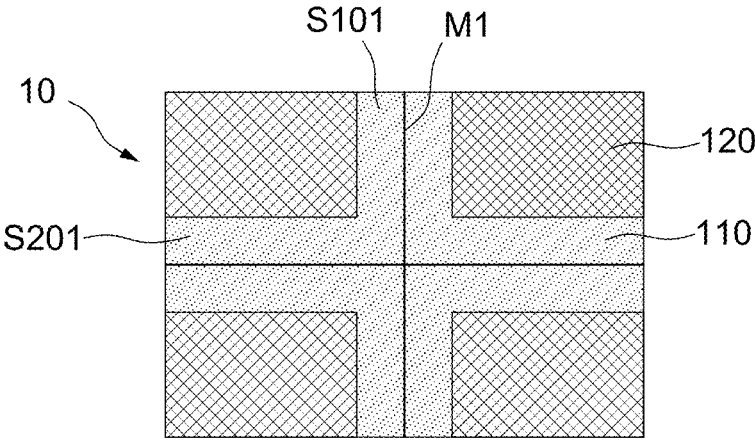
FIG. 9B illustrates a top view of a semiconductor structure in accordance with some embodiments of the present disclosure.

FIG. 9A illustrates a top view of a semiconductor structure in accordance with some comparative embodiments of the present disclosure, and FIG. 9B illustrates a top view of a semiconductor structure in accordance with some embodiments of the present disclosure.

As shown in FIG. 9A, in some comparative embodiments, a cutting operation is performed on the semiconductor substrate 20 by scanning a laser beam along the cutting lines sequentially and continuously in one operation, meandering lines M2 having winding and irregular shapes are likely to be formed on an upper surface of the semiconductor substrate 20. Such winding and irregular meandering lines M2 are disadvantageous to the separation of the semiconductor substrate 20 along the cutting lines S801 and S801'.

In contrast, as shown in FIG. 9B, according to some embodiments of the present disclosure, the semiconductor substrate 10 are performed with two or more separate cutting operations along two or more sets of cutting lines that are arranged interlacedly or alternatively. Therefore, meandering lines M1 formed on an upper surface of the semiconductor substrate 10 have unwinding shapes and are substantially aligned the cutting lines S101 and S201 of the semiconductor substrate 10. Such unwinding meandering lines M1 can prevent fracture and/or chipping of the semiconductor substrate 10, and thus the semiconductor substrate 10 can be cut (or separated) accurately along the cutting lines.

In addition, compared to the cases where a semiconductor substrate or wafer is singulated by a cutting tool (e.g., a cutting knife or a cutting blade), diamond abrasive grains generated from the collision between the cutting tool and the semiconductor or wafer in a high speed cutting operation may cause chipping issues to the semiconductor or wafer. Besides, the hourly output (unit per hour; UPH) of the singulation operation may be relatively poor by using a cutting knife or a cutting blade. In contrast, according to some embodiments of the present disclosure, the semiconductor substrate 10 is cut by laser beam along two or more sets of cutting lines arranged interlacedly, not only the heat accumulation can be reduced, but the hourly output (UPH) can also be increased significantly, e.g., for about four times the UPH of the singulation operation by a cutting knife or a cutting blade. Moreover, the cutting operation may be free of diamond abrasive grains generated from a cutting knife or a cutting blade, and thus the yields can be increased as well.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A method of manufacturing a semiconductor structure, comprising:
   providing a semiconductor substrate having an active surface;
   scanning a first linear portion in an interior region of the semiconductor substrate by a laser beam along a first direction substantially parallel to the active surface of the semiconductor substrate;
   scanning a second linear portion in the interior region of the semiconductor substrate by the laser beam along a second direction opposite to the first direction after scanning the first linear portion; and
   scanning a third linear portion in the interior region of the semiconductor substrate by the laser beam along the first direction or the second direction after scanning the second linear portion, wherein the third linear portion is between the first linear portion and the second linear portion.

2. The method as claimed in claim 1, wherein the first linear portion, the second linear portion, and the third linear portion are scanned from the active surface of the semiconductor substrate.

3. The method as claimed in claim 1, wherein the semiconductor substrate comprises a plurality of device regions on the active surface, and the first linear portion, the second linear portion, and the third linear portion are free from overlapping the device regions in a direction substantially perpendicular to the active surface of the semiconductor substrate.

4. The method as claimed in claim 1, wherein the first linear portion, the second linear portion, and the third linear portion are at a substantially same elevation that is substantially parallel to the active surface of the semiconductor substrate.

5. The method as claimed in claim 1, wherein the first linear portion, the second linear portion, and the third linear portion are scanned by the laser beam along three different cutting lines.

6. The method as claimed in claim 1, further comprising scanning a fourth linear portion and a fifth linear portion in the interior region of the semiconductor substrate by the laser beam along a third direction and a fourth direction opposite to the third direction after scanning the third linear portion, the third direction and the fourth direction being substantially perpendicular to the first direction and substantially parallel to the active surface of the semiconductor substrate.

* * * * *